(12) United States Patent
Uhlig et al.

(10) Patent No.: US 12,148,718 B2
(45) Date of Patent: Nov. 19, 2024

(54) HOUSING, SEMICONDUCTOR MODULE AND METHODS FOR PRODUCING THE SAME

(71) Applicant: Infineon Technologies AG, Neubiberg (DE)

(72) Inventors: Johannes Uhlig, Soest (DE); Jens Krugmann, Paderborn (DE); Ulrich Nolten, Rüthen (DE); Regina Nottelmann, Bad Sassendorf (DE); Arthur Unrau, Geseke (DE)

(73) Assignee: Infineon Technologies AG, Neubiberg (DE)

( * ) Notice: Subject to any disclaimer, the term of this patent is extended or adjusted under 35 U.S.C. 154(b) by 201 days.

(21) Appl. No.: 17/699,666

(22) Filed: Mar. 21, 2022

(65) Prior Publication Data

US 2022/0310536 A1 Sep. 29, 2022

(30) Foreign Application Priority Data

Mar. 25, 2021 (EP) .................................... 21164771

(51) Int. Cl.
*H01L 23/00* (2006.01)
*H01L 21/48* (2006.01)
*H01L 23/053* (2006.01)
*H01L 23/49* (2006.01)
*H01L 25/07* (2006.01)
(Continued)

(52) U.S. Cl.
CPC .......... *H01L 23/564* (2013.01); *H01L 21/481* (2013.01); *H01L 23/053* (2013.01); *H01L 23/49* (2013.01); *H01L 25/072* (2013.01); *H01L 23/24* (2013.01); *H01L 23/3135* (2013.01)

(58) Field of Classification Search
CPC ... H01L 23/564; H01L 21/481; H01L 23/053; H01L 23/49; H01L 25/072; H01L 21/50; H01L 23/06; H01L 2224/32225; H01L 2224/48227; H01L 2224/48472; H01L 2224/73265; H01L 23/10; H01L 23/24; H01L 2924/181; H01L 21/4803;
(Continued)

(56) References Cited

U.S. PATENT DOCUMENTS

| | | | |
|---|---|---|---|
| 2009/0230487 A1* | 9/2009 | Saitoh ................. | B81C 1/00333 257/659 |
| 2015/0001700 A1* | 1/2015 | Hartung ................ | H01L 23/564 438/126 |

(Continued)

FOREIGN PATENT DOCUMENTS

| | | |
|---|---|---|
| DE | 102013216035 B3 | 1/2015 |
| EP | 3422399 A1 | 1/2019 |
| EP | 3460837 A1 | 3/2019 |

*Primary Examiner* — Patricia D Valenzuela
(74) *Attorney, Agent, or Firm* — Murphy, Bilak & Homiller, PLLC (57) ABSTRACT

A housing for a power semiconductor module arrangement includes sidewalls and a lid. The lid includes a first layer of a first material having a plurality of openings, and second layer of a second material that is different from the first material. The second layer completely covers a bottom surface of the first layer. The second layer includes a plurality of protrusions, each protrusion extending into a different one of the plurality of openings of the first layer such that each of the plurality of openings is completely covered by one of the protrusions.

14 Claims, 4 Drawing Sheets

(51) Int. Cl.
*H01L 23/24* (2006.01)
*H01L 23/31* (2006.01)

(58) Field of Classification Search
CPC ............... H01L 23/49811; H01L 23/04; H01L 23/3735; H01L 23/08; H01L 23/3135
See application file for complete search history.

(56) References Cited

U.S. PATENT DOCUMENTS

2016/0254255 A1    9/2016   Hori et al.
2017/0301891 A1*   10/2017   Kwak ................... H01M 4/525

\* cited by examiner

HOUSING, SEMICONDUCTOR MODULE AND METHODS FOR PRODUCING THE SAME

TECHNICAL FIELD

The instant disclosure relates to a housing, a semiconductor module comprising a housing, and to methods for producing the same.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate. The controllable semiconductor devices are usually mounted to the semiconductor substrate by soldering or sintering techniques.

Electrical lines or electrical connections are used to connect different semiconductor devices of the power semiconductor arrangement. Such electrical lines and connections may include metal and/or semiconductor material. The housings of power semiconductor module arrangements are generally permeable to gases to a certain extent. Some gases such as sulfur containing gases, for example, may react with metallic components inside the housing. This leads to a chemical degradation of these components which may result in a failure of individual components and ultimately of the whole semiconductor arrangement.

There is a need for a housing and a power semiconductor module comprising a housing wherein the semiconductor components are protected against corrosion such that the overall lifetime of the power semiconductor module arrangement is increased.

SUMMARY

A housing for a power semiconductor module includes sidewalls and a lid. The lid includes a first layer of a first material comprising a plurality of openings, and second layer of a second material that is different from the first material, wherein the second layer completely covers a bottom surface of the first layer, and the second layer comprises a plurality of protrusions, each protrusion extending into a different one of the plurality of openings of the first layer such that each of the plurality of openings is completely covered by one of the protrusions.

A power semiconductor module includes a semiconductor substrate, at least one semiconductor body arranged on a top surface of the semiconductor substrate, and the housing, wherein the semiconductor substrate with the at least one semiconductor body arranged thereon is arranged within the housing.

A method for forming a lid of a housing includes forming a first layer of a first material including a plurality of openings, forming a second layer of a second material that is different from the first material, wherein the second layer includes a plurality of protrusions, and arranging the second layer on the first layer such that the second layer completely covers a bottom surface of the first layer, and each protrusion extends into a different one of the plurality of openings of the first layer such that each of the plurality of openings is completely covered by one of the protrusions.

Another method for producing a housing includes forming, in a mold, a first layer of a first material including a plurality of openings, after forming the first layer, forming, in the same mold, a second layer of a second material that is different from the first material, wherein the second layer is formed including a plurality of protrusions, the second layer completely covers a bottom surface of the first layer, and each protrusion extends into a different one of the plurality of openings of the first layer such that each of the plurality of openings is completely covered by one of the protrusions.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
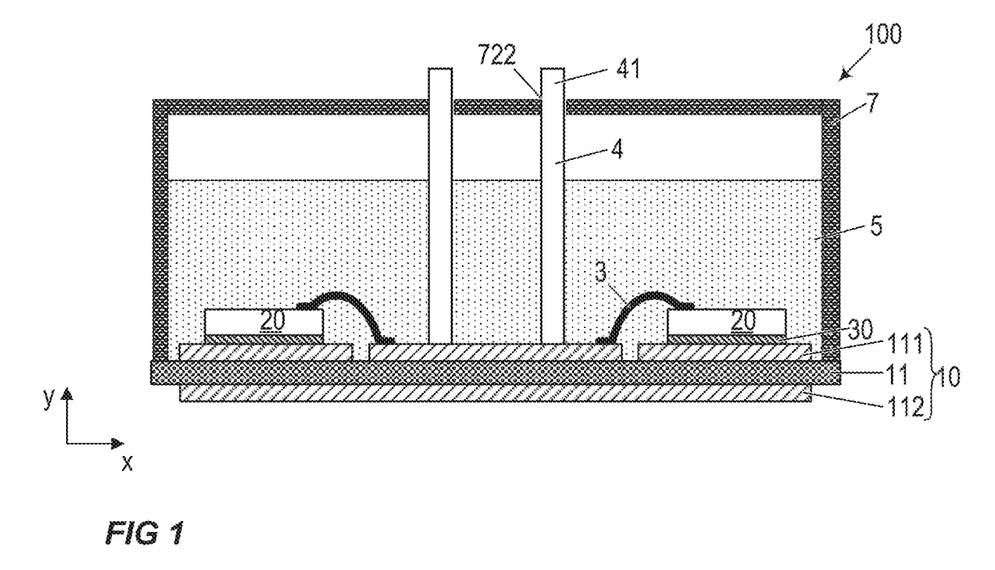
FIG. 1 is a cross-sectional view of a power semiconductor module arrangement.

Referring to FIG. 1, a cross-sectional view of a power semiconductor module arrangement 100 is illustrated. The power semiconductor module arrangement 100 includes a housing 7 and a semiconductor substrate 10. The semiconductor substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BrN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The semiconductor substrate 10 is arranged in a housing 7. In the example illustrated in FIG. 1, the semiconductor substrate 10 forms a ground surface of the housing 7, while the housing 7 itself solely comprises sidewalls and a cover. This is, however, only an example. It is also possible that the housing 7 further comprises a ground surface and the semiconductor substrate 10 be arranged inside the housing 7. According to another example, the semiconductor substrate 10 may be mounted on a base plate (not illustrated). In some power semiconductor module arrangements 100, more than one semiconductor substrate 10 is arranged on a single base plate. The base plate may form a ground surface of the housing 7, for example.

One or more semiconductor bodies 20 may be arranged on the semiconductor substrate 10. Each of the semiconductor bodies 20 arranged on the semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element.

The one or more semiconductor bodies 20 may form a semiconductor arrangement on the semiconductor substrate 10. In FIG. 1, only two semiconductor bodies 20 are exemplarily illustrated. The second metallization layer 112 of the semiconductor substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. Different semiconductor bodies 20 may be mounted to the same or to different sections of the first metallization layer 111. Different sections of the first metallization layer may have no electrical connection or may be electrically connected to one or more other sections using, e.g., bonding wires 3. Electrical connections 3 may also include connection plates or conductor rails, for example, to name just a few examples. The one or more semiconductor bodies 20 may be electrically and mechanically connected to the semiconductor substrate 10 by an electrically conductive connection layer 30. Such an electrically conductive connection layer may be a solder layer, a layer of an electrically conductive adhesive, or a layer of a sintered metal powder, e.g., a sintered silver powder, for example.

The power semiconductor module arrangement 100 illustrated in FIG. 1 further includes terminal elements 4. The terminal elements 4 are electrically connected to the first metallization layer 111 and provide an electrical connection between the inside and the outside of the housing 7. The terminal elements 4 may be electrically connected to the first metallization layer 111 with a first end, while a second end 41 of the terminal elements 4 protrudes out of the housing 7. The terminal elements 4 may be electrically contacted from the outside at their second end 41. The terminal elements 4 illustrated in FIG. 1, however, are only examples. Terminal elements 4 may be implemented in any other way and may be arranged anywhere within the housing 7. For example, one or more terminal elements 4 may be arranged close to or adjacent to the sidewalls of the housing 7. Any other suitable implementation is possible.

The semiconductor bodies 20 each may include a chip pad metallization, e.g., a source, drain, gate, anode or cathode metallization. A chip pad metallization generally provides a contact surface for electrically connecting the semiconductor body 20. The chip pad metallization may electrically contact a connection layer 30, a terminal element 4, or an electrical connection 3, for example. A chip pad metallization may consist of or include a metal such as aluminum, copper, gold or silver, for example. The electrical connections 3 and the terminal elements 4 may also consist of or include a metal such as copper, aluminum, gold, or silver, for example.

The above-mentioned components, as well as other components of the power semiconductor module arrangement 100 inside the housing 7, may corrode when they come into contact with corrosive gases. Corrosive gases may include, e.g., sulfur or sulfur-containing compounds such as hydrogen sulfide $H_2S$, for example. Corrosive gases in the surrounding area of the power semiconductor module arrangement 100 may penetrate into the inside of the housing 7. The housings 7 that are used for power semiconductor module arrangements 100 are usually not fully protected against intruding gases. Inside the housing 7, the corrosive gases may form acids or solutions, for example, in combination with moisture that may be present inside the housing 7. The corrosive gases or the resulting solutions may cause a corrosion of some or all of the components. During the corrosion process, the metallic constituents of the components may be oxidized to their respective sulfides. The sulfide formation may alter the electrical properties of the components or may result in the formation of new conductive connections and in short circuits within the power semiconductor module arrangement 100.

Further, when exposed to corrosive gases and further under the influence of electric fields and possibly moisture, dendritic structures may form from mobile metal ions (e.g., Cu, Ag, etc.) of the metal comprising components and structures of the power semiconductor module arrangement 100 and anions (e.g., $S^{2-}$) that are present in the corrosive gas. A dendrite is a characteristic tree-like structure of crystals. Dendritic growth in metal layers has large consequences with regard to material properties and is generally unwanted Examples for corrosive gases are hydrogen sulfide ($H_2S$), carbonyl sulfide (OCS), or gaseous sulfur ($S_8$). In some applications, the power semiconductor module arrangement may be exposed to corrosive gases such as $Cl^-$, $SO_x$, or $NO_x$, for example. Generally, it is also possible that sulfur gets to the inside of the housing 7 as constituent of a solid material or liquid.

Components and structures including one or more metals such as copper (e.g., first metallization layer 111, electrical connection 3, terminal element 4, connection layer 30, chip pad metallization), silver (e.g., first metallization layer 111, electrical connection 3, terminal element 4, connection layer 30, chip pad metallization), or lead (e.g. connection layer 30 including leaded solder), may be particularly sensitive to corrosion. Other metals such as aluminum, for example, may have a thin oxide layer covering their surface area, which may provide at least a certain amount of protection against corrosive gases.

Conventional power semiconductor module arrangements 100 generally further include a casting compound 5. The casting compound 5 may consist of or include a silicone gel or may be a rigid molding compound, for example. The casting compound 5 may at least partly fill the interior of the housing 7, thereby covering the components and electrical connections that are arranged on the semiconductor substrate 10. The terminal elements 4 may be partly embedded in the casting compound 5. At least their second ends 41, however, are not covered by the casting compound 5 and protrude from the casting compound 5 through the housing 7 to the outside of the housing 7. The casting compound 5 is configured to protect the components and electrical connections inside the power semiconductor module 100, in particular inside the housing 7, from certain environmental conditions and mechanical damage. The casting compound 5 further provides for an electrical isolation of the components inside the housing 7. However, corrosive gases are usually able to penetrate through the casting compound 5. The casting compound 5, therefore, is usually not able to protect the components and electrical connections from corrosive gases.

The casting compound 5 may form a protective layer in a vertical direction y of the semiconductor substrate 10. The vertical direction is a direction that is essentially perpendicular to a top surface of the semiconductor substrate 10. The top surface of the semiconductor substrate 10 is a surface on which semiconductor bodies 20 are or may be mounted. The casting compound 5 at least partly covers any components that are arranged on the top surface of the semiconductor substrate 10 as well as any exposed surfaces of the semiconductor substrate 10.

Figure 2:
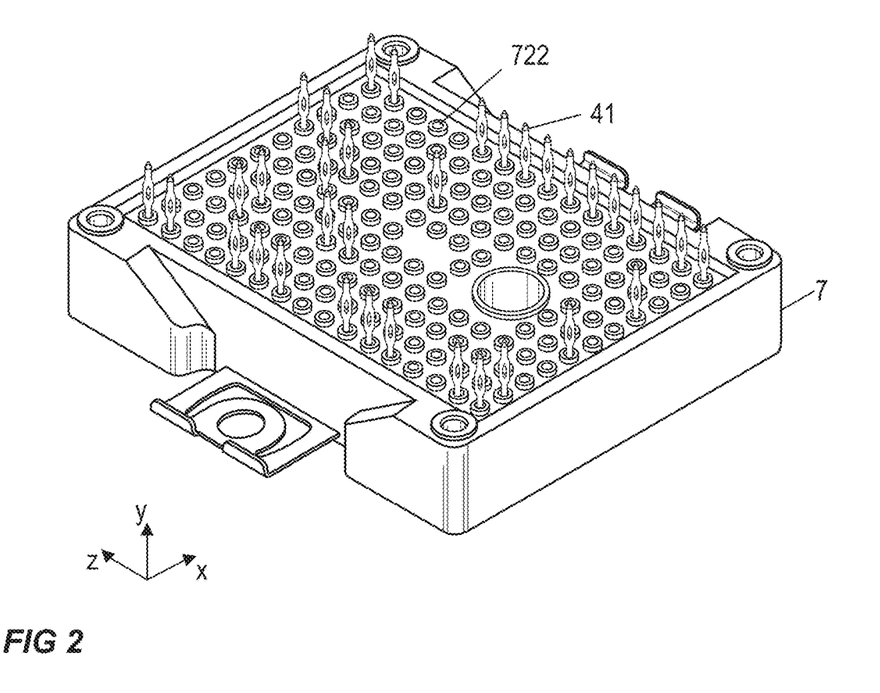
FIG. 2 is a side perspective view of a power semiconductor module arrangement.

FIG. 2 schematically illustrates a semiconductor module with a plurality of terminal elements 4 (first ends 41 of terminal elements) protruding out of the lid of the housing 7. The lid in this example comprises a plurality of openings 722. Terminal elements 4 protrude out of some but not all of the openings 722. By providing a plurality of openings 722 in the lid, one and the same housing 7 can be used for many different layouts or applications without the need for customizing the housing 7 for specific applications or customers. However, each of the openings 722 is a weak spot of the housing 7 through which corrosive gases may enter the inside of the housing 7. This applies for each of the plurality of openings 722, regardless of whether or not a terminal element 4 protrudes through the opening 722. A casting compound 5 as described above may not provide sufficient protection against corrosive gases.

Figure 3:
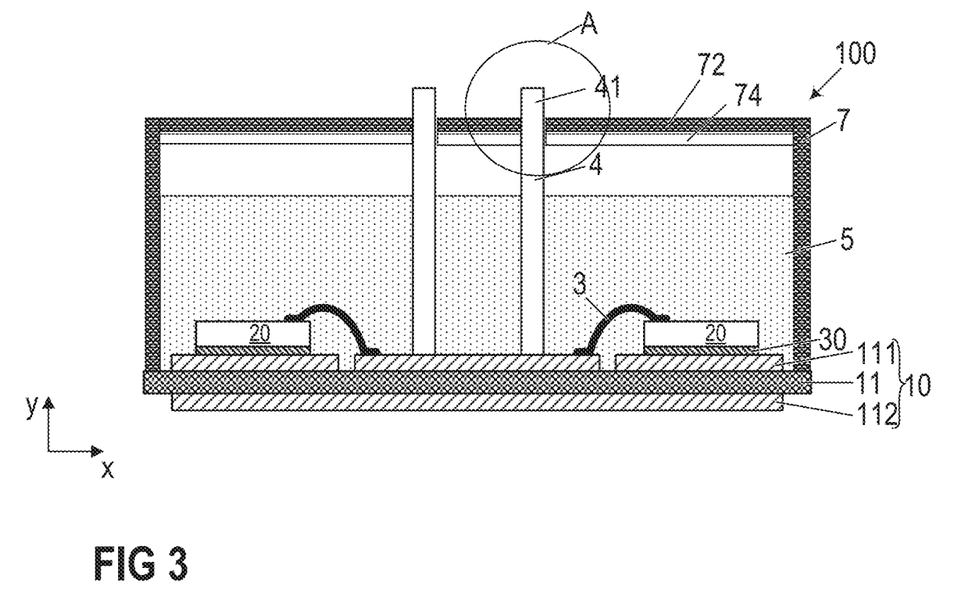
FIG. 3 is a cross-sectional view of a power semiconductor module arrangement comprising a housing according to one example.

Therefore, to better protect the metallic components of the power semiconductor module arrangement 100 against corrosive gases, the cover 7 comprises a first layer 72 and a second layer 74. This is schematically illustrated in FIG. 3. The power semiconductor arrangement 100 illustrated in FIG. 3 essentially corresponds to the power semiconductor module arrangement 100 illustrated in FIG. 1. The only difference being the housing 7. While the housing 7 illustrated in FIG. 1 is a single layer housing comprising only a single layer of a first material, the housing 7 illustrated in FIG. 3 is a double layer housing comprising a first layer 72 of a first material and a second layer 74 of a second material that is different from the first material 72. In the example illustrated in FIG. 3, only the lid of the housing 7 comprises two layers 72, 74, while the sidewalls of the housing 7 comprise only the first layer. This, however, is only an example. According to another example the sidewalls and/or a bottom of the housing 7 also comprise the first layer 72 and the second layer 74. The terminal elements 4 protrude through the openings 722 formed in the housing 7.

Figure 4:
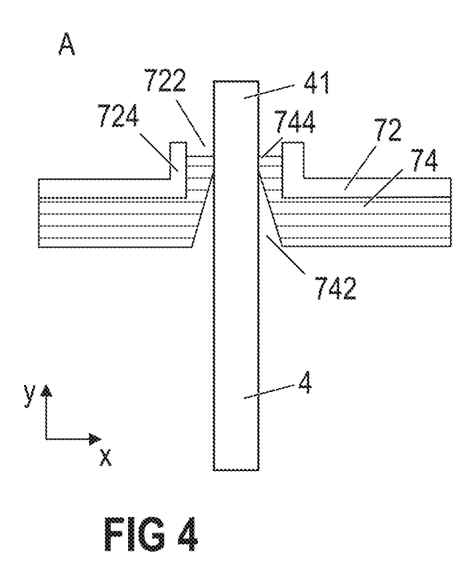
FIG. 4 is a cross-sectional view of a section A as indicated in FIG. 3 according to one example.
Figure 5:
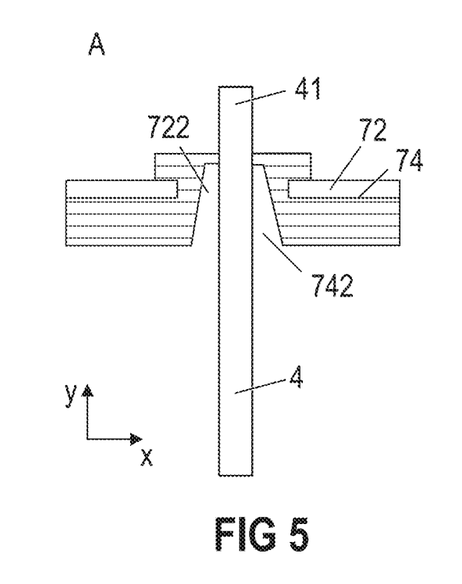
FIG. 5 is a cross-sectional view of a section A as indicated in FIG. 3 according to another example.
Figure 6:
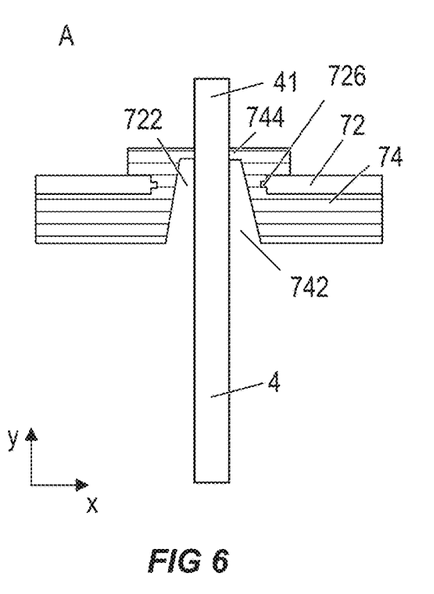
FIG. 6 is a cross-sectional view of a section A as indicated in FIG. 3 according to an even further example.

This is exemplarily illustrated in further detail in FIGS. 4 to 6. FIG. 4 exemplarily illustrates a section A of the arrangement of FIG. 3 in greater detail. As is illustrated in FIG. 3 and will be described in further detail with respect to FIGS. 10A and 10B below, the first layer 72 comprises a plurality of openings 722. Only one of the plurality of openings 722 is exemplarily illustrated in FIG. 4. The second layer 74 is arranged adjacent to and directly adjoins the first layer 72. The second layer 74 is arranged on the inside of the housing 7, whereas the first layer 72 is arranged on the outside of the housing 7. The second layer 74 completely covers a bottom side of the first layer 72 (i.e., the lid), wherein a bottom side of the first layer 72 (the lid) is a side which faces the inside of the housing 7. The second layer 74 at least partly extends into each of the plurality of openings 722. In this way, any gaps or spaces between the first layer 72 and the terminal element 4 are sealed by the second layer 74 when a terminal element 4 extends through the opening 722.

When the housing 7 is mounted on a power semiconductor module arrangement and at least one terminal element 4 protrudes through at least one of the openings 722, the first layer 72 is not in direct contact with the at least one terminal element 4. For example, each of the openings 722 may have a round, square, or any other suitable cross-section, and the terminal element 4 may protrude centrally through the opening 722. The second layer 74 on the other hand adjoins and directly contacts each of the terminal elements 4. In this way, each of the plurality of openings 4 is sealed to prevent air, moisture and corrosive gases from entering the inside of the housing 7.

In the example illustrated in FIG. 4, the first layer 72 forms a collar or sleeve 724 around the opening 722. The second layer 74 at least partly extends into this collar or sleeve 724. That is, the second layer 74 may comprise at least one protrusion, each protrusion extending into one of the plurality of openings 722. A cross-sectional area of a terminal element 4 is smaller than a cross-sectional area of the opening 722. If, for example, the terminal element 4 and the opening 722 each have a rounded cross-section, a diameter of the terminal element 4 may be smaller than a diameter of the respective opening. In order to facilitate the insertion of the terminal element 4, the second layer 74 in the range of the protrusion and the opening 722 may form a funnel 742. When inserting the terminal element 4 into the opening, the terminal element 4 may first be inserted into the wider side of the funnel 742 and, from there, be led through the center of the opening 722.

Now referring to FIG. 5, the collar or sleeve 724 around the openings 722 may be omitted. To prevent the second layer 74 from unintentionally slipping out of the opening 722, the protrusion of the second layer 74 may extend through the opening 722 and cover parts of the first layer 72 that are arranged on the outside of the housing 7. That is, the second layer 74 completely covers a bottom surface of the first layer 72 and partly covers a top surface of the first layer 72. In this way, in the range of the openings 722, the first layer 72 is sandwiched between portions of the second layer 74.

According to an even further example illustrated in FIG. 6, the first layer 72 may comprise protrusions 726 around the circumference of the opening 722. The first layer 72 may have a first thickness in a vertical direction y. A thickness of the protrusion 726 in the same vertical direction y is smaller than the first thickness. Such protrusions 726 may provide a further fixation of the second layer 74 to prevent it from unintentionally slipping out of the opening 722. The protrusion 726 may have any suitable form.

Figure 7:
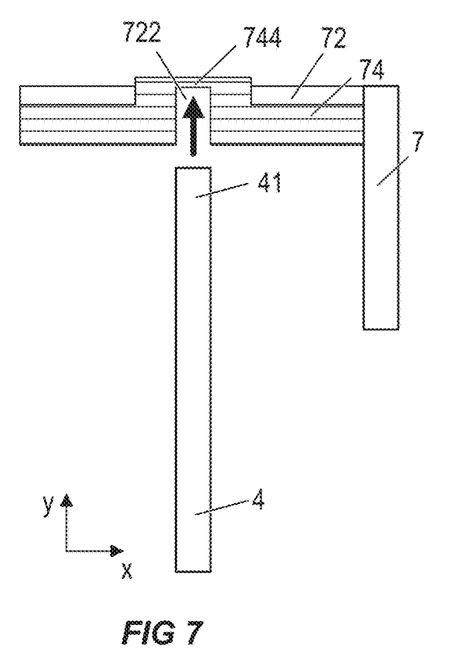
FIG. 7 is a cross-sectional view of a section of a housing according to an example before inserting a terminal element through one of the openings.

Now referring to FIG. 7, the first and second layers 72, 74 are schematically illustrated before inserting the terminal element 4 through the opening 722. Before inserting the terminal element 4 into the opening 722, the second layer 74 completely covers the opening 722. According to one example, a thickness of the second layer 74 in the vertical direction y may be smaller in the range of the openings 722 as compared to a thickness of the second layer 74 in the same direction in those sections where it covers the bottom surface of the first layer 72. In this way a plurality of membranes 744 can be formed, each of which covers one of the plurality of openings 722. A terminal element 4 can easily penetrate through the membrane 744 when inserting it through the opening 722. The opening 722, however, is still sufficiently sealed after inserting the terminal element 4. That is, the sealing between the terminal element 4 and the second layer 74 is realized by the penetration of the terminal element 4 through the second layer 74 and the elastic behavior of the material of the second layer 74. When penetrating through the membrane 744, the first end 41 of the terminal element 4 opens a small hole in the second layer 74. After this initial hole has been formed, the material of the second layer 74 elastically moves to allow the terminal element 4 to advance further through the hole. When the terminal element 4 is in its final position, the material of the second layer 74 due to its elastic properties forms a tight collar around the terminal element 4.

Optionally, the membrane 744 can have specific structures such as, e.g., predetermined breaking points, to allow for a controlled rupture and to support the formation of the collar around the terminal element 4. According to another example, it is also possible to first penetrate those membranes 744 through which a terminal element 4 is to be inserted by means of a needle before inserting the terminal elements 4 in the holes 722. Holes 722 through which no terminal element 4 is to be inserted remain covered and sealed by the membrane 744 formed by the second layer 74.

Figure 8:
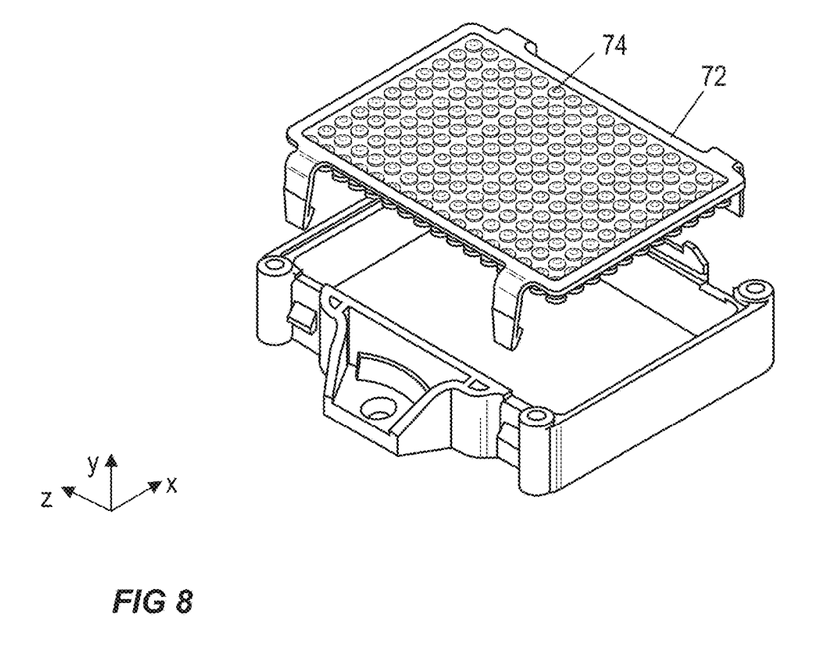
FIG. 8 is a top perspective view of a housing for a power semiconductor module arrangement according to one example.
Figure 9:
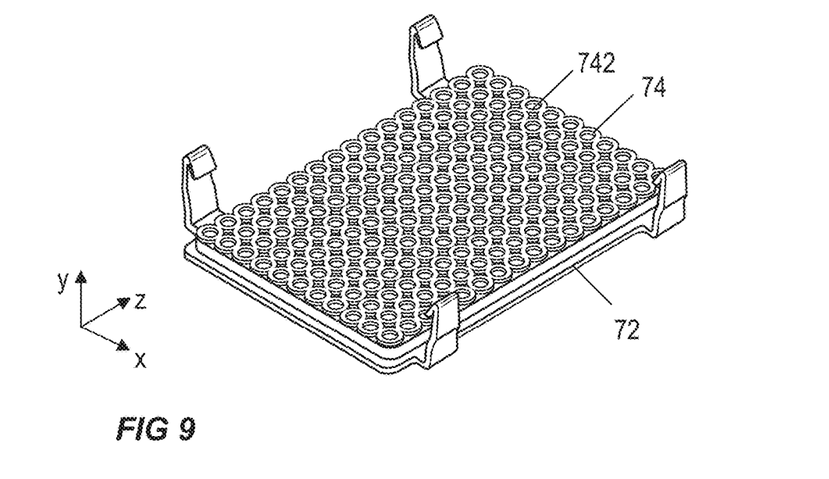
FIG. 9 is a bottom perspective view of a housing for a power semiconductor module arrangement according to one example.

Now referring to FIG. 8, a housing 7 is schematically illustrated before mounting it to a power semiconductor module arrangement. That is, the plurality of openings 722 of the first layer 72 are still completely covered by the second layer 74 which protrudes at least partly through the openings 722. FIG. 9 schematically illustrates the housing 7 from the inside where a plurality of funnels 742 is visible.

Referring again to FIG. 7, the second layer 74 may further provide a seal between the lid or cover and the sidewalls of the housing. The lid and the sidewalls of the housing 7 may be produced as a separate pieces. In this way, the sidewalls can be mounted to the power semiconductor module arrangement first with the lid still open. The material forming the casting compound 5 can be filled into the housing 7 before mounting the lid to the sidewalls. In this way, an additional opening in the lid through which the material could be inserted into the housing 7 can be omitted. However, if the lid and sidewalls are provided as separate pieces, corrosive gases may enter the housing 7 in the range of the points of contact between the lid and the sidewalls. The second layer 74 in a horizontal direction x may adjoin the sidewalls after assembling the lid and the sidewalls. In this way, any unintended gaps between the first layer 72 of the sidewalls and the first layer 72 of the lid can be covered by the second layer 74. The second layer 74 due to its elastic properties may form a tight seal between the sidewalls and the lid.

As has been described above, the first layer 72 comprises a first material and the second layer 74 comprises a second material that is different from the first material. In particular, the first material can be a comparably rigid material. In this way, the housing 7 can provide sufficient protection against mechanical damage. The second material, on the other hand, can be a material that is soft as compared to the first material. The second material can further comprise certain elastic properties. This allows the terminal elements 4 to penetrate through the membranes 744 formed by the second layer 74 and to tightly close any gaps between the first layer 72 and the terminal elements 4. The first layer 72, for example, can comprise any kind of hard plastic materials or epoxy. The second layer 74 can comprise at least one of soft polymers, silicones, (thermoplastic) elastomers, polyurethanes, acrylates, or rubbers, for example. According to one example, the first layer 72 may have a hardness of at least 30 Shore D, or at least 50 Shore D. The second layer 74, for example, may have a hardness of 40 Shore A or less, or of 20 Shore A or less, or of 50 Shore 00 or less.

To even better protect the metallic components of the power semiconductor module arrangement 100 against corrosive gases, the second layer 74 of the housing may further include a reactant, for example. The reactant may be configured to chemically react with the corrosive gases, or, in particular, with the sulfur or sulfur-containing compounds of the corrosive gases. Corrosive gas may also be trapped, adsorbed or absorbed by the reactant. By chemically reacting with the corrosive gas, the reactant further prevents the harmful substances from reaching the (metal) components inside the housing 7 and thereby protects the components against corrosion. The reactant may be, for example, a powder of a third material which is distributed throughout the second material of the second layer 74. The third material may include any materials, e.g., metallic materials, which react with the corrosive gases and which may, e.g., form a metal sulfide when exposed to corrosive gases. The reactant may be essentially evenly distributed throughout the second material of the second layer 74.

The second layer 74 may adhere to the first layer, e.g., by means of chemical bonding, mechanical interlock or any other suitable connection method. An example of a mechanical interlock has been described by means of FIGS. 5 and 6 above. Depending on the materials used for the first layer 72 and the second layer 74, a chemical bond may be formed between the layers 72, 74, for example. According to one example, the second layer 74 has a certain adhesiveness such that it adheres to the first layer to a certain degree without the need for any mechanical interlocks.

The housing 7 can be produced using any suitable technique such as, e.g., (2K) injection molding, manual assembly of separately produced injection molded or casted parts, and dispensing of a soft component on an injection molded part.

Figure 10A:
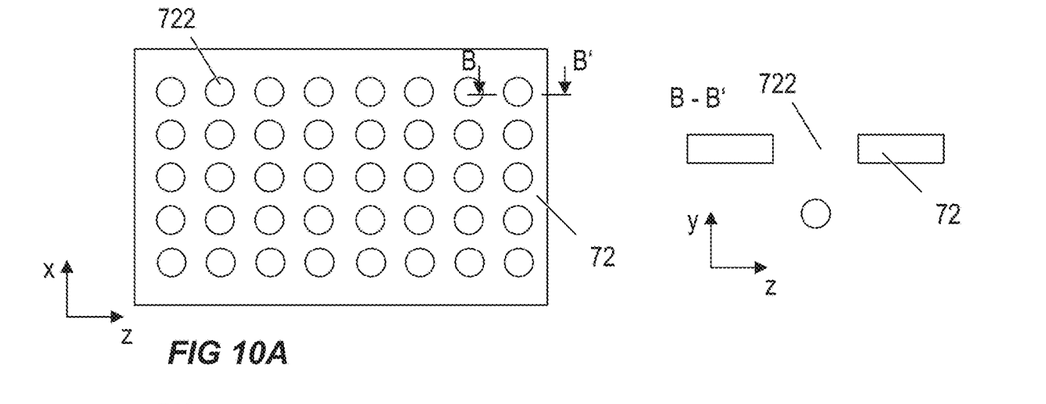
FIGS. 10A and 10B schematically illustrate a method for producing a housing according to one example.
Figure 10B:
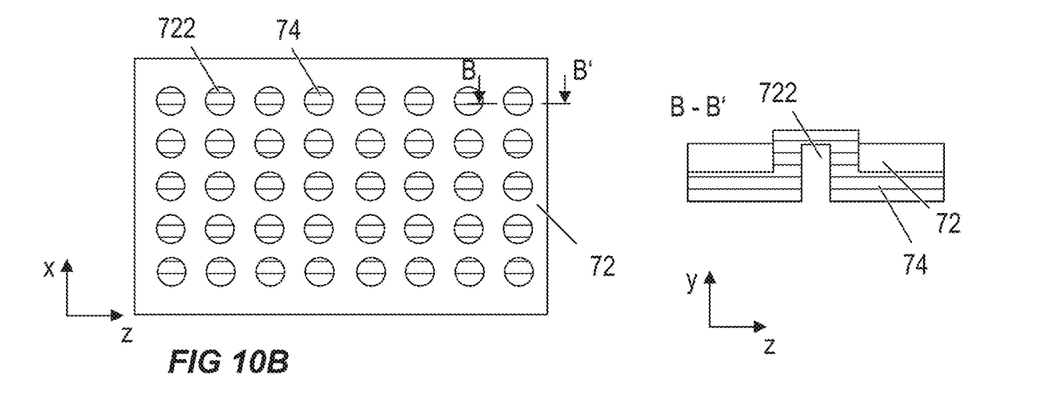

Now referring to FIGS. 10A and 10B, an example of a method for producing a housing 7 is exemplarily illustrated. As is illustrated in the top view of FIG. 10A, in a first step a first layer 72 of a first material is formed. The first layer 72 may have a rectangular or square cross-section, for example, and comprise a plurality of openings 722. According to one example, the plurality of openings 722 are distributed over the plane of the first layer 72 in a regular pattern. This, however, is only an example. The plurality of openings 722 can be distributed over the plane of the first layer 72 in any suitable way. One of the openings 722 is schematically illustrated in the cross-sectional view on the right side of FIG. 10A. The first layer 72 can be formed in any suitable way such as, e.g., injection molding.

According to one example, the first layer 72 may remain in the mold and the second layer 74 is formed directly on the first layer 72 in the same mold. The step of forming the second layer 74 is schematically illustrated in FIG. 10B. The second layer 74 is formed to comprise a plurality of protrusions, wherein each of the protrusions extends into one of the plurality of openings 722. This is schematically illustrated in the cross-sectional view on the right side of FIG. 10B. This method can be used, for example, if the second layer 74 is formed according to the examples described by means of FIGS. 5 and 6 above.

According to another example, the second layer 74 is formed separately, e.g., in a separate mold. The second layer 74 may be removed from the mold and the first layer 72 and the second layer 74 may then be assembled. That is, the second layer 74 may be placed on the first layer 72 such that the protrusions of the second layer 74 protrude into the openings 722 of the first layer 72. This method can be used, for example, if the second layer 74 is formed according to the example described by means of FIG. 4 above.

In order to form a power semiconductor module arrangement, the lid that is formed by means of the method described in FIGS. 10A and 10B may be connected to sidewalls in order to form a housing 7 that is then arranged to enclose at least one substrate 10 (see, e.g., FIG. 3).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A housing for a power semiconductor module arrangement, the housing comprising:
    sidewalls; and
    a lid,
    wherein the lid comprises:
        a first layer of a first material comprising a plurality of openings; and
        a second layer of a second material that is different from the first material,
    wherein the second layer completely covers a bottom surface of the first layer,
    wherein the second layer comprises a plurality of protrusions, each protrusion extending into a different one of the plurality of openings of the first layer such that each of the plurality of openings is completely covered by one of the protrusions.

2. The housing of claim 1, wherein the second material is softer than the first material.

3. The housing of claim 1, wherein the first material has a hardness of at least 30 Shore D, and wherein the second material has a hardness of 40 Shore A or less.

4. The housing of claim 1, wherein the first material comprises at least one of a plastic material and epoxy, and wherein the second material comprises at least one of a soft polymer, a silicone, an elastomer, a thermoplastic elastomer, polyurethane, acrylate, and rubber.

5. The housing of claim 1, wherein the first layer comprises a plurality of collars or sleeves, each collar or sleeve being arranged around another one of the plurality of openings, and wherein each of the protrusions of the second layer at least partly extends into a different collar or sleeve.

6. The housing of claim 1, wherein each of the protrusions of the second layer protrudes through one of the openings of the first layer and partly covers a top surface of the first layer, and wherein the top surface is a surface opposite the bottom surface.

7. The housing of claim 1, wherein each protrusion of the second layer forms a membrane, each membrane extending horizontally across each of the different one of the plurality of openings of the first layer such that each membrane covers one of the openings of the first layer.

8. The housing of claim 7, wherein a thickness of each membrane formed by the second layer in a vertical direction is less than a thickness of the second layer in the same direction in those sections where the second layer covers the first layer.

9. The housing of claim 1, wherein the second layer adheres to the first layer.

10. A power semiconductor module arrangement, comprising:
    a semiconductor substrate;
    at least one semiconductor body arranged on a top surface of the semiconductor substrate; and
    a housing comprising sidewalls and a lid, wherein the lid comprises a first layer of a first material comprising a plurality of openings and a second layer of a second material that is different from the first material, wherein the second layer completely covers a bottom surface of the first layer, wherein the second layer comprises a plurality of protrusions, each protrusion extending into a different one of the plurality of openings of the first layer such that each of the plurality of openings is completely covered by one of the protrusions, wherein the semiconductor substrate with the at least one semiconductor body arranged thereon is arranged within the housing.

11. The power semiconductor module arrangement of claim 10, further comprising at least one terminal element, wherein:

a first end of each of the at least one terminal element extends through an inside of the housing; and a second end of each of the at least one terminal element protrudes through the second layer and through one of the openings to an outside of the housing.

12. The power semiconductor module arrangement of claim 11, wherein the second layer is in direct contact with each of the at least one terminal element.

13. The power semiconductor module arrangement of claim 10, wherein the second layer in a horizontal plane adjoins the sidewalls of the housing, thereby forming a seal between the sidewalls and the lid of the housing.

14. The power semiconductor module arrangement of claim 10, wherein each protrusion of the second layer forms a membrane, each membrane extending horizontally across each of the different one of the plurality of openings of the first layer such that each membrane covers one of the plurality of openings of the first layer.

* * * * *